(12) United States Patent
Chu et al.

(10) Patent No.: US 10,071,905 B2
(45) Date of Patent: Sep. 11, 2018

(54) MICRO-ELECTRO MECHANICAL SYSTEM (MEMS) STRUCTURES WITH THROUGH SUBSTRATE VIAS AND METHODS OF FORMING THE SAME

(71) Applicant: Taiwan Semiconductor Manufacturing Company, Ltd., Hsin-Chu (TW)

(72) Inventors: Chia-Hua Chu, Hsinchu County (TW); Kuei-Sung Chang, Kaohsiung (TW); Te-Hao Lee, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/289,794

(22) Filed: Oct. 10, 2016

(65) Prior Publication Data
US 2017/0022049 A1    Jan. 26, 2017

Related U.S. Application Data

(63) Continuation of application No. 13/429,029, filed on Mar. 23, 2012, now Pat. No. 9,466,532.
(Continued)

(51) Int. Cl.
*B81B 7/00* (2006.01)
*H01L 21/768* (2006.01)
(Continued)

(52) U.S. Cl.
CPC .......... *B81B 7/007* (2013.01); *B81C 1/00269* (2013.01); *H01L 21/76898* (2013.01); *B81B 2207/07* (2013.01); *B81B 2207/095* (2013.01); *B81C 2203/0109* (2013.01); *B81C 2203/036* (2013.01); *B82Y 30/00* (2013.01)

(58) Field of Classification Search
CPC .. B81B 7/007; B81B 2207/095; B81B 7/0032
See application file for complete search history.

(56) References Cited

U.S. PATENT DOCUMENTS

| 5,344,524 A * | 9/1994 | Sharma | H01L 21/2007 148/DIG. 12 |
| 6,180,496 B1 * | 1/2001 | Farrens | H01L 21/187 257/E21.088 |

(Continued)

FOREIGN PATENT DOCUMENTS

WO    WO-2010-059118    5/2010

*Primary Examiner* — Tucker J Wright
(74) *Attorney, Agent, or Firm* — Haynes and Boone, LLP

(57) ABSTRACT

The present disclosure includes micro-electro mechanical system (MEMS) structures and methods of forming the same. Substrates of the MEMS structures are bonded together by fusion bonding at high processing temperatures, which enables more complete removal of chemical species from the dielectric materials in the substrates prior to sealing cavities of the MEMS structures. Fusion bonding of MEMS structures reduces outgassing of chemical species and is compatible with the cavity formation process. The MEMS structures bonded by fusion bonding are mechanically stronger compared to eutectic bonding due to a higher bonding ratio. In addition, fusion bonding enables the formation of through substrate vias (TSVs) in the MEMS structures.

20 Claims, 9 Drawing Sheets

Related U.S. Application Data

(60) Provisional application No. 61/593,187, filed on Jan. 31, 2012.

(51) Int. Cl.
  *B81C 1/00* (2006.01)
  *B82Y 30/00* (2011.01)

(56) References Cited

U.S. PATENT DOCUMENTS

| | | | |
|---|---|---|---|
| 6,664,126 | B1 | 12/2003 | Devoe et al. |
| 6,789,423 | B2 | 9/2004 | An et al. |
| 7,250,112 | B2 | 7/2007 | Nasiri et al. |
| 7,449,355 | B2 | 11/2008 | Lutz et al. |
| 7,723,141 | B2 | 5/2010 | Robert et al. |
| 7,859,091 | B2 | 12/2010 | Fujii et al. |
| 7,919,814 | B2 | 4/2011 | Goto et al. |
| 8,169,678 | B2 | 5/2012 | Hoffman et al. |
| 8,283,738 | B2 | 10/2012 | Fujii et al. |
| 8,367,477 | B2 | 2/2013 | Chien et al. |
| 8,557,679 | B2 | 10/2013 | Chuang et al. |
| 8,569,090 | B2 | 10/2013 | Taheri et al. |
| 8,659,155 | B2 | 2/2014 | Cheng et al. |
| 8,673,756 | B2 | 3/2014 | Graham et al. |
| 8,759,926 | B2 | 6/2014 | Fujii et al. |
| 8,836,116 | B2 | 9/2014 | Yang et al. |
| 9,362,139 | B2 | 9/2016 | Ebefors et al. |
| 2004/0259325 | A1 | 12/2004 | Gan |
| 2005/0112843 | A1 | 5/2005 | Fisher et al. |
| 2006/0211233 | A1 | 9/2006 | Gan et al. |
| 2008/0042260 | A1 | 2/2008 | Jeong et al. |
| 2009/0049911 | A1 | 2/2009 | Fukuda et al. |
| 2009/0261430 | A1* | 10/2009 | Suzuki .............. B81B 7/007 257/417 |
| 2011/0221455 | A1 | 9/2011 | Feyh et al. |
| 2012/0313235 | A1* | 12/2012 | Chu .................. B81B 3/0005 257/692 |

* cited by examiner

MICRO-ELECTRO MECHANICAL SYSTEM (MEMS) STRUCTURES WITH THROUGH SUBSTRATE VIAS AND METHODS OF FORMING THE SAME

CROSS-REFERENCE TO RELATED APPLICATION

The present application is a continuation application of U.S. patent application Ser. No. 13/429,029, filed Mar. 23, 2012, entitled "MICRO-ELECTRO MECHANICAL SYSTEM (MEMS) STRUCTURES WITH THROUGH SUBSTRATE VIAS AND METHODS OF FORMING THE SAME" issuing as U.S. Pat. No. 9,466,532, which claims priority to U.S. Provisional Patent Application No. 61/593,187, filed on Jan. 31, 2012, each of which are incorporated herein by reference in its entirety.

TECHNICAL FIELD

The present disclosure relates generally to the field of semiconductor package systems and, more particularly, to micro-electro mechanical system (MEMS) structures and methods of forming the same.

BACKGROUND OF THE DISCLOSURE

The semiconductor integrated circuit (IC) industry has experienced rapid growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component that can be created using a fabrication process) has decreased. Such advances have increased the complexity of processing and manufacturing ICs and, for these advances to be realized, similar developments in IC processing and manufacturing are needed.

Micro-electro mechanical system (MEMS) devices are a recent development in the field of integrated circuit technology. MEMS devices include devices fabricated using semiconductor technology to form mechanical and electrical features. Examples of MEMS devices include gears, levers, valves, and hinges. Common applications of MEMS devices include accelerometers, pressure sensors, actuators, mirrors, heaters, and printer nozzles.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
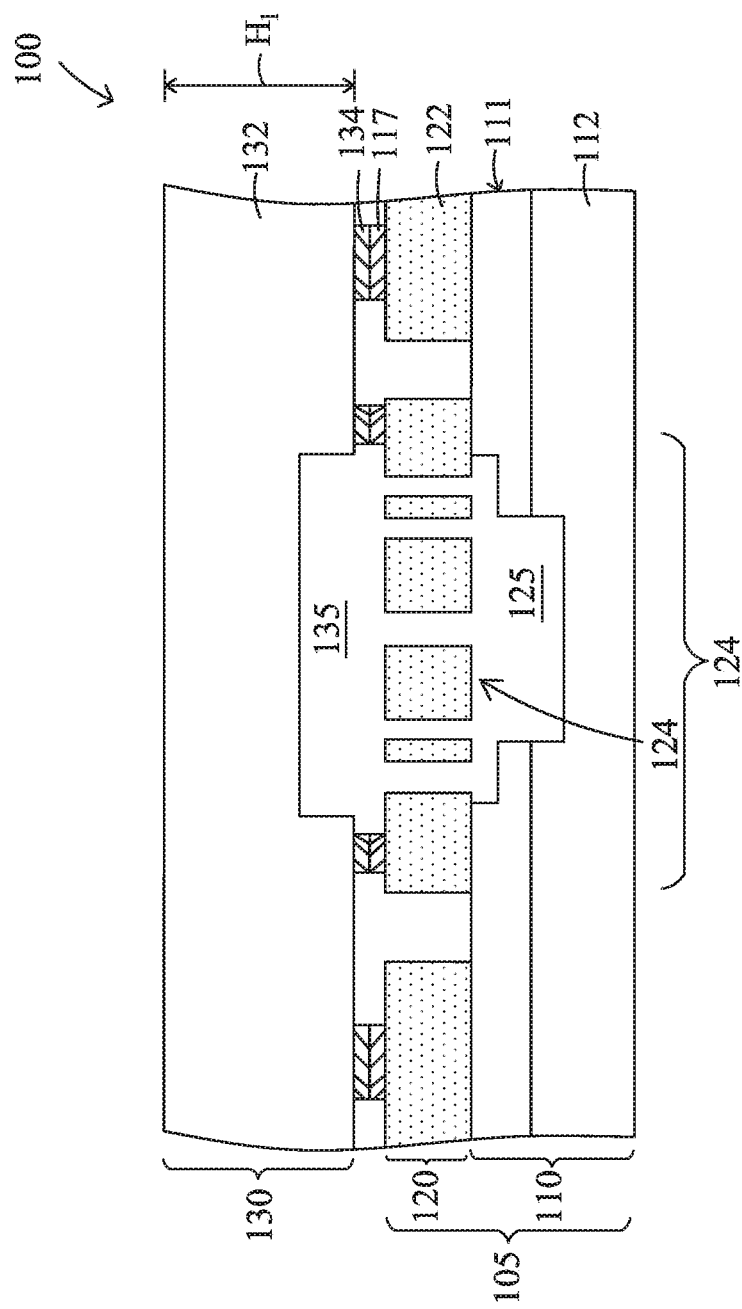
FIG. 1 is a schematic cross-sectional view of an exemplary micro-electro mechanical system (MEMS) structure, in accordance with some embodiments.

Generally, a micro-electro mechanical system (MEMS) package system has a plurality of substrates that are bonded to each other. In a MEMS package system, a MEMS device is disposed in at least one cavity that is sealed by the bonded substrates. The cavity is vacuumed such that the operation of the MEMS device in the space is less affected. The substrates may have a plurality of dielectric materials that are used to form an integrated circuit. Chemical species may outgas from the dielectric materials into the cavity. The gases may change the environment around the MEMS device and affect the operation of the MEMS device.

It is understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one feature's relationship to another feature. The spatially relative terms are intended to cover different orientations of the device including the features.

The present disclosure is associated with MEMS structures and methods of forming the same. The substrates of the MEMS structures are bonded together by fusion bonding at relatively high processing temperatures, which enables more complete removal of chemical species from the dielectric materials in the substrates prior to sealing cavities of the MEMS structures. Fusion bonding makes high temperature annealing on both sides wafers possible, which reduces outgassing of chemical species during the cavity formation process. The MEMS structures bonded by fusion bonding are mechanically stronger compared to metal bonding due to a higher bonding ratio. In addition, fusion bonding enables the formation of through substrate vias (TSVs) in the MEMS structures without degrading yield. Following are descriptions regarding various exemplary MEMS structures and methods of forming the same. It is noted that the MEMS structures and methods described below are merely exemplary. The scope of this application is not limited thereto.

FIG. 1 is a schematic cross-sectional view of an exemplary micro-electro mechanical system (MEMS) structure 100 in accordance with some embodiments. In FIG. 1, a substrate structure 130 is bonded to a substrate structure 105. In some embodiments, the substrate structure 105 includes substrate structures 110 and 120 that are bonded to each other. In some embodiments, the substrate structures 105 and 130 are assembled to form a hermetic or non-hermetic package system. In some embodiments, the substrate structures 110, 120 and 130 include substrates 112, 122 and 132, respectively. In some embodiments, the substrate structure 130 is referred to as a capping substrate structure. The substrate 132 is referred to as a capping substrate. The substrate 122 is referred to as a MEMS substrate. The substrate 112 is referred to as an integrated circuit substrate.

However, substrate 132 may have integrated circuits and substrate 112 may not include any integrated circuits in some embodiments.

In some embodiments, the substrates 112, 122 and 132 each include the same or different materials and may comprise any suitable combination of materials. For example, the substrates 112, 122 and 132 each can be a semiconductor substrate that includes an elementary semiconductor including silicon and/or germanium; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate can have a gradient SiGe feature in which the Si and Ge composition change from one ratio at one location to another ratio at another location of the gradient SiGe feature. The alloy SiGe can be formed over a silicon substrate. The SiGe substrate may be strained. Furthermore, the substrates 112, 122 and/or 132 can be a semiconductor on insulator (SOI). In some examples, the substrates 112, 122 and/or 132 include a doped epi layer. In other examples, the substrates 112, 122 and/or 132 include a multilayer compound semiconductor structure. Alternatively, the substrates 112, 122 and/or 132 include a non-semiconductor material, such as a glass, fused quartz, or calcium fluoride.

In some embodiments, the substrate structures 110, 120 and/or 130 include at least one complementary metal-oxide-semiconductor (CMOS) integrated circuit, at least one micro-electro mechanical system (MEMS) device, other integrated circuits, and/or any combinations thereof. In some embodiments, the substrate structures 110, 120 and/or 130 include an interposer structure, which represents a substrate that may merely include a conductive wire routing for an electrical connection and be free from including any active device.

For example, the substrate structure 105 includes an integrated circuit structure 111 formed over the substrate 112 as shown in FIG. 1. In some embodiments, the integrated circuit structure 111 is formed, for example, by a complementary metal-oxide-semiconductor (CMOS) technology. The integrated circuit structure 111 includes, for example but not limited to, a logic circuit, an analog circuit, a mixed-signal circuit, and/or any suitable integrated circuit. In some embodiments, the integrated circuit structure 111 includes an interconnect metallization structure (not labeled) that is formed over the substrate 112. The interconnect metallization structure is configured to provide electrical interconnections among active devices and/or passive devices formed on and/or over the substrate 112 and/or 122.

In some embodiments, the interconnect metallization structure includes inter-metal dielectric (IMD) materials. In some embodiments, each of the IMD materials include at least one material, such as silicon oxide, silicon nitride, silicon oxynitride, silicon carbide, silicon oxycarbide, low dielectric constant (low-k) dielectric material, ultra low-k dielectric material, other dielectric materials, or any combinations thereof. In some embodiments, the substrate structures 110 and 120 are bonded together by any suitable method, such as fusion or eutectic bonding processes. For example, the fusion bonding process involves bringing the substrate structures 110 and 120 into intimate contact, which causes the substrates 110 and 120 to bond together due to atomic attraction forces (i.e., Van der Waals forces). The substrate structures 110 and 120 are then subjected to an annealing process, after which a solid bond, e.g., a covalent bond, may be formed between the substrate structures 110 and 120. A temperature for the annealing process is any suitable temperature, such as between about 200° C. and about 350° C. The fusion bonding process can arise from SiO$_2$/Si bonding, Si/Si bonding, and/or other suitable bonding.

In some embodiments, the eutectic bonding process is applied between any alloy suitable for the bonding temperature boundary condition. For example, the eutectic bonding process includes metal/metal bonding and/or metal/semiconductor bonding, such as Ge/Al bonding, Ge/Au bonding, Si/Au bonding, Si/Al bonding, and/or other suitable bonding. If the bonding process involves a substrate including CMOS devices, the bonding temperature is controlled to be near or lower than a CMOS device temperature. The eutectic bonding processes may occur at high pressure and at any suitable temperature, such as between about 400° C. and 450° C.

In some embodiments, the interconnect metallization structure includes a plurality of metallic layers (not shown). The metallic layers are electrically coupled with each other through at least one via plug structure, e.g., a via plug structure. In some embodiments, the interconnect metallization structure is made of at least one material, such as aluminum (Al), copper (Cu), tungsten (W), cobalt (Co), platinum (Pt), silicon (Si), germanium (Ge), titanium (Ti), tantalum (Ta), gold (Au), nickel (Ni), tin (Sn), other suitable metallic materials, and/or any combinations thereof. Alternatively, the interconnect metallization structure includes doped polysilicon, which can sustain higher processing temperature than some metal materials.

Referring again to FIG. 1, the substrate structure 120 includes at least one MEMS device, e.g., a MEMS device 124. In some embodiments, the MEMS device 124 includes a plurality of elements formed of metal, polysilicon, dielectric, and/or other materials. The MEMS device 124 can include materials typically used in a CMOS fabrication process. Any configuration of the MEMS device 124 is possible, depending on the desired functionality. One or more of the elements depicted may be designed to provide MEMS mechanical structures. The MEMS mechanical structures may include structures or elements operable for mechanical movement. The MEMS device 124 can be formed using processes used in CMOS fabrication, for example, photolithography, etching processes (e.g., wet etch, dry etch, plasma etch), deposition processes, plating processes, and/or other suitable processes, which may utilize one or more masking or patterning steps. In some embodiments, the MEMS device 124 includes a motion sensor (e.g., a gyroscope, an accelerometer, etc.), a radio frequency (RF) MEMS device (e.g., an RF switch, filter, etc.), an oscillator, a MEMS microphone, micro mirror or any other MEMS structures.

FIG. 1 shows that the substrate structures 105 and 130 are bonded together by bonding structure 117 on substrate structure 105, or on substrate 122, and bonding pad structure 134 on substrate structure 130, in accordance with some embodiments. The bonding pad structures 117 and 134 each include a bonding material that is suitable for bonding. For example, the bonding pad structure 134 includes at least one semiconductor material, e.g., Ge, Si, silicon-germanium ($Si_xGe_{1-x}$), other semiconductor materials, and/or any combinations thereof. The bonding pad structure 117 includes at least one metallic material, e.g., Al, Cu, Ti, Ta, Au, Ni, Sn, other metallic materials, and/or any combinations. In other embodiments, the bonding pad structures 117 and 134 each include at least one metallic material, e.g., Al, Cu, Ti, Ta, Au, Ni, Sn, other metallic materials, and/or any combinations.

Bonding pad structures 117 and 134 are bonded together by a thermal process to form a eutectic phase after being pressed together. For example, if bonding pad structures 134 are made of Ge and bonding pad structures 117 are made of Al, an annealing process at a temperature ranging from about 400° C. to 450° C. would allow bond pad structures 117 and 134 be bonded together by eutectic bonding. For bonding of such bond pad structures, pressure needs to be applied on substrate structures 105 and 130 to hold the bonding pad structures 117 and 134 together during the annealing process. Due to the pressure required to hold the bonding pad structures 117 and 134 together, the percentage of surfaces occupied by the boding pad structures to the surface area of substrate structures 130 (or 105) having such bond pad structures is limited to increase the pressure applied. In some embodiments, the percentage of areas of the bonding pad structures, which is also called a bonding ratio, is limited to about 5%-30% of the area of substrate structures 105 and 130. The bonding ratio reduces the flexibility of circuit design, since there are only limited areas available for forming structures between MEMS devices in the bonded substrates for external connection.

In some embodiments, the substrate structure 110 includes a cavity 125, which is below and encircles MEMS device 124 to provide space between the MEMS device 124 and the substrate structure 110. In some embodiments, substrate structure 130 also includes a cavity 135, which is above and encircles MEMS device 124 to provide space between the MEMS device 124 and substrate structure 130. Cavities 125 and 135 allow the MEMS device 124 to move freely. The cavities 125 and 135, or the space surrounding the MEMS device 124, are vacuumed such that the operation of the MEMS device 124 in the space surrounding it is less affected. Cavities 125 and/or 135 may be formed by a wet or dry etching process, or a combination thereof in accordance with some embodiments. In some embodiments, an HF solution is used in removing dielectric materials, such as silicon dioxide. Using HF solution to remove dielectric material(s) may also be called HF release. The formation of MEMS device 124 requires HF release, in accordance with some embodiments. The HF solution used may attack (or corrode) eutectic bonding structure that includes metal. Therefore, it is a challenge to integrate eutectic bonding with MEMS structures.

As shown in FIG. 1, a portion of cavity 125 is formed in the IC structure 111, which includes one or more IMD materials, as described above. Similarly, the cavity 135 of substrate structure 130 may also be formed by removing one or more dielectric layers, which are similar to the IMD materials in IC structure 111, in the substrate structure 130. The unstable chemicals in the IMD materials, such as unbound chemicals and/or unstable organic materials could outgas under vacuum pressure, which is what the cavities 125 and 135 are under after bonding. The outgassed chemicals could deposit on the MEMS device 124 and/or walls of the cavities 125 and 135 to cause performance degradation of the MEMS device 124. During the bonding process, the thermal process for forming eutectic bonding of bonding pad structures 134 and 117 could release part of the unstable chemicals from the IMD materials. However, the relatively low thermal anneal (or bonding) temperature, such as equal to or less than about 450° C., is insufficient to remove (or release) all unstable chemicals in the IMD materials. The unstable chemicals left in the IMD materials could outgas after bonding when the MEMS device 124 is under vacuum pressure to degrade performance. In FIG. 1, $H_1$ defines the thickness of substrate 132.

After eutectic bonding is performed, external contacts are formed, which involves applying mechanical force on the package, on substrate structure 130 or substrate 112. For example, drilling to form openings in substrate structure 130 or substrate 112 and thinning down substrate 112 may be involved. Due to the low bonding ratio, the MEMS package is fragile for such a formation process of external contacts and yield could suffer. Therefore, integrating eutectic bonding with the formation process of external contacts is challenging.

Figure 2A:
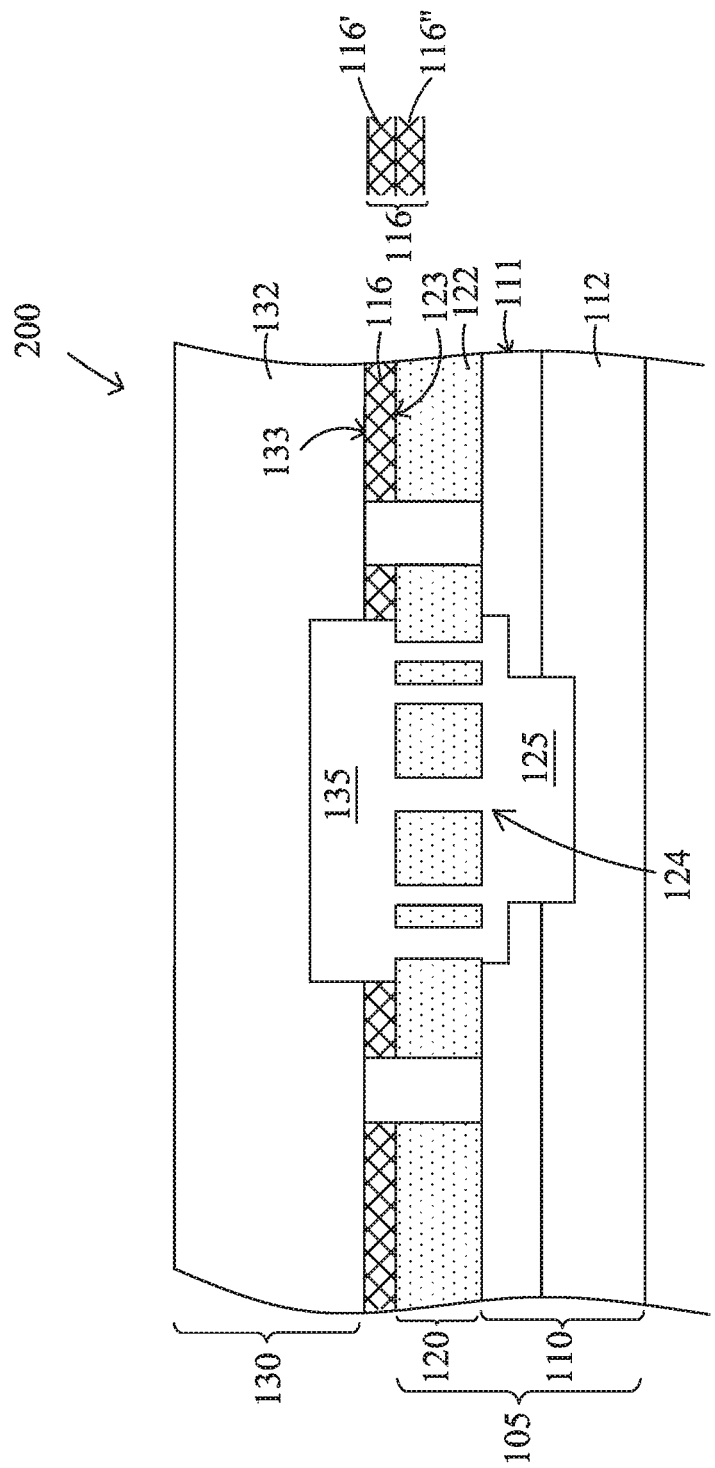
FIGS. 2A-2H are cross-sectional views of a sequential process of packaging a MEMS device, in accordance with some embodiments.

FIGS. 2A-2H are cross-sectional views of a sequential process of packaging a MEMS structure 200, in accordance with some embodiments. FIG. 2A shows a substrate structure 130 is provided and is bonded with substrate structure 105. Brief descriptions of substrate structures 130 and 105 have been provided above. FIG. 2A shows that the substrate structures 105 and 130 are bonded together by a bonding layer 116 through fusion bonding, in accordance with some embodiments. The fusion bonding may be between Si (silicon) and Si or between Si and silicon dioxide ($SiO_2$), in accordance with some embodiments. For example, if the fusion bonding is between Si and Si, a bonding layer 116 made of Si may be formed on substrate 122 to bond with a Si surface 133 of substrate 132, in accordance with some embodiments. In some other embodiments, the bonding layer 116 is formed on substrate 132 to bond with a Si surface 123 of substrate 122. In yet some other embodiments, a Si sub-layer 116' is formed on substrate 132 to bond with a Si sub-layer 116" formed on substrate 122 to form layer 116. If the fusion bonding is between Si and $SiO_2$, the bonding layer 116 is made of $SiO_2$ and may be formed on substrate 132 or substrate 122 to form fusion bonding with a Si surface on the other substrate. In some embodiments, the bonding layer has thickness in a range from about 10 Å to about 2000 Å.

Fusion bonding between Si and Si may be achieved by making the Si surfaces hydrophobic first. The Si surfaces of the two substrates are then pressed together and annealed to form Van der Waals bonds between Si surfaces on two substrates. If none of the substrates have interconnect structures involving metal materials, the substrates may be heated to a high temperature in a range from about 900° C. to about 1200° C. during fusion bonding process. The high bonding temperature enables most of the chemicals in the IMDs to outgas. As a result, the problem of outgassing described above is reduced in comparison with eutectic bonding. If fusion bonding is between Si and $SiO_2$, the surfaces of Si and $SiO_2$ are made hydrophilic first. The Si and $SiO_2$ surfaces of the two substrates are then pressed together and annealed at a temperature in a range from about 500° C. to about 1200° C. to form Van der Waals bonds between Si surfaces on two substrates. A fusion bonding temperature of about 500° C. is slightly higher than the eutectic bonding temperature of between about 400° C. to about 450° C. Outgassing of IMDs is more complete when the annealing temperature is equal to or greater than about 450° C. The outgassing of chemicals in the IMDs under $Si/SiO_2$ fusion bonding at a temperature greater than about 450° C. and less than about 1200° C. would be more complete in comparison to eutectic bonding. Therefore, the outgassing issue is reduced by fusion bonding at the temperature ranges mentioned above. Fusion bonding under the temperature ranges mentioned above is not compatible with bonding substrate structures including a metal interconnect. In the situation that interconnect is needed, doped polysilicon may be used in place of metal materials.

Since fusion bonding does not involve metal, it is compatible with the HF release process used in the formation of MEMS structures. In addition, fusion bonding includes surface treatment and high bonding temperature and does not use pressure as high as the pressure used in eutectic bonding, to push the substrates together. As a result, the bonding ratio for fusion bond is higher, such as in a range from about 40% to about 95%, than the bonding ratio of eutectic bonding. In some embodiments, the fusion bonding ratio is in a range from about 50% to about 95%. Higher bonding ratio of fusion bonding makes the packaged MEMS structures mechanically stronger in comparison with packed MEMS structures formed using eutectic bonding. Higher bonding ratio of fusion bonding also increases design flexibility by providing a higher number of locations to place electrical connections in comparison with packed MEMS structures formed using eutectic bonding.

In comparison to eutectic bonding, fusion bonding of substrates to form MEMS package described above reduces outgassing and metal corrosion issues described above. Fusion bonding also makes the packaged MEMS package stronger and enables more design flexibility. The concern of fragile package by eutectic bonding being incompatible with the formation process of external contacts can be decreased. FIGS. 2B-2H are cross-sectional views of a sequential process of forming external contacts utilizing TSVs, in accordance with some embodiments.

Figure 2B:
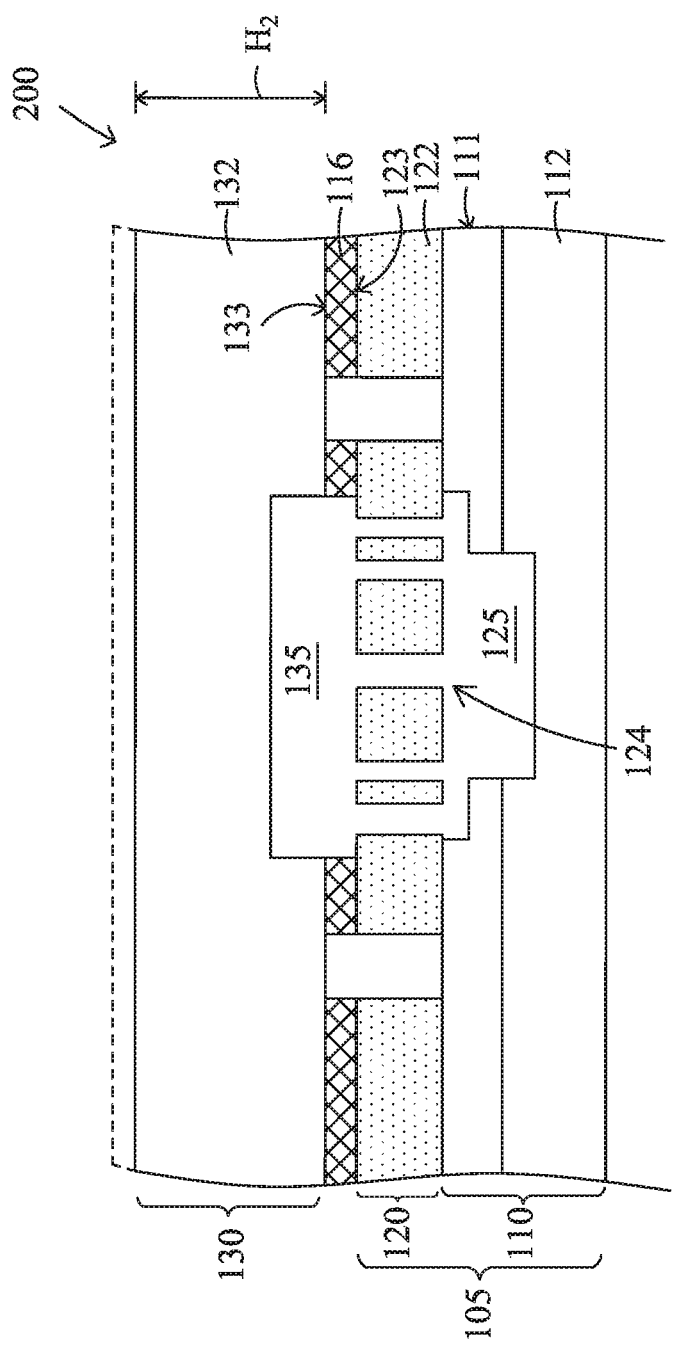

FIG. 2B is a cross-sectional view of MEMS structure 200 after a backside of substrate 132 has been thinned, in accordance with some embodiments. The backside of substrate 132 is thinned to make the TSVs having shorter heights to avoid the aspect ratios of the TSVs being too high. FIG. 2B shows that substrate 132 is thinned from an original thickness $H_1$ to a thickness $H_2$. The thinning process can be an etching process, a polishing process, or a grinding process.

Figure 2C:
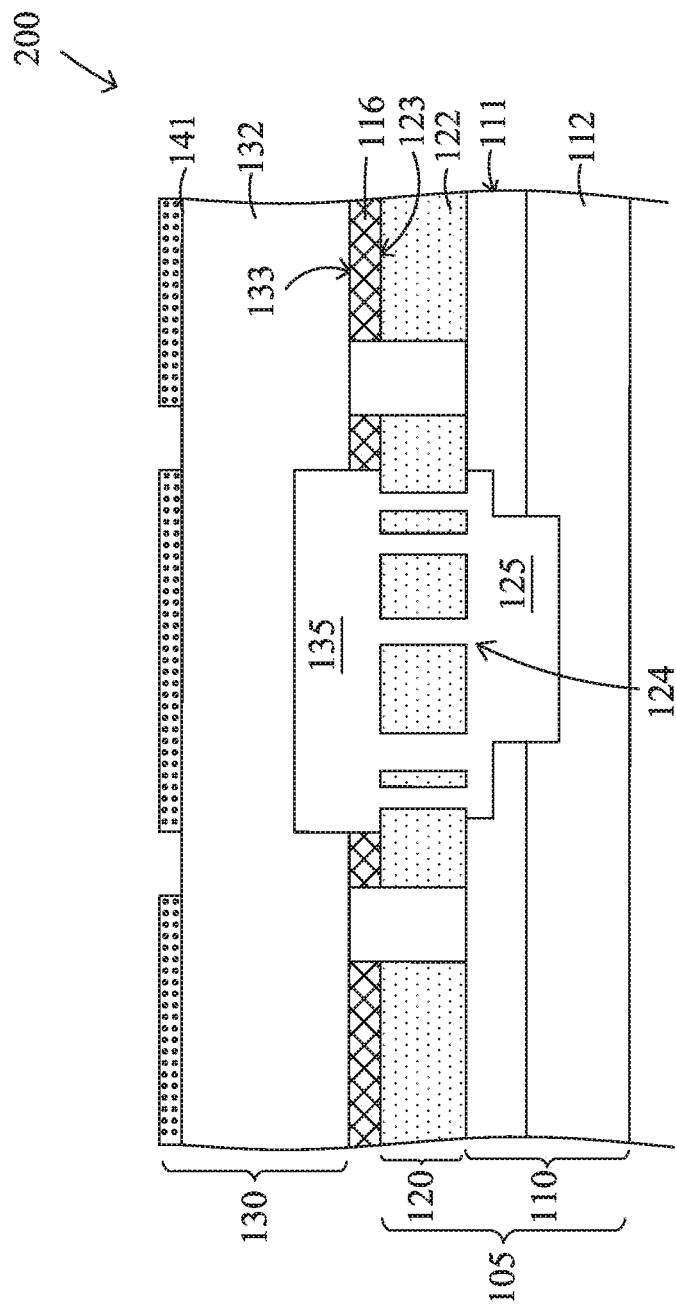

After substrate 132 is thinned, the backside surface of substrate 132 is patterned by a photoresist 141 to expose surface areas for forming TSVs, as depicted in FIG. 2C in accordance with some embodiments. Afterwards as in FIG. 2D, TSV openings 145 are formed by etching the material layers under TSV openings 145 to contact substrate 122 by etching the material under the exposed surface areas. Residual photoresist 141 is removed and an isolation layer 142 is deposited to cover the exposed surfaces of substrate 132, in accordance with some embodiments. Exposed surfaces of substrate 132 are covered by the isolation layer 142 including inner walls of TSV openings 145. The isolation layer 142 is made of a dielectric material, such as oxide, nitride, or a combination of both. One example of a material for the isolation layer 142 is silicon oxide deposited by plasma enhanced chemical vapor deposition (PECVD) using silane or tetraethylorthosilicate (TEOS) as the silicon source. In some embodiments, the isolation layer has a thickness ranging from about 500 Å to about 15000 Å. The isolation layer 132 can also be deposited (or grown) by a thermal process, such as a thermally grown oxide, or a thermal CVD oxide. Other types of dielectric materials may also be used. In some embodiments, the width $W_1$ of the TSVs is in a range from about 10 microns (μm) to about 150 μm.

Figure 2D:
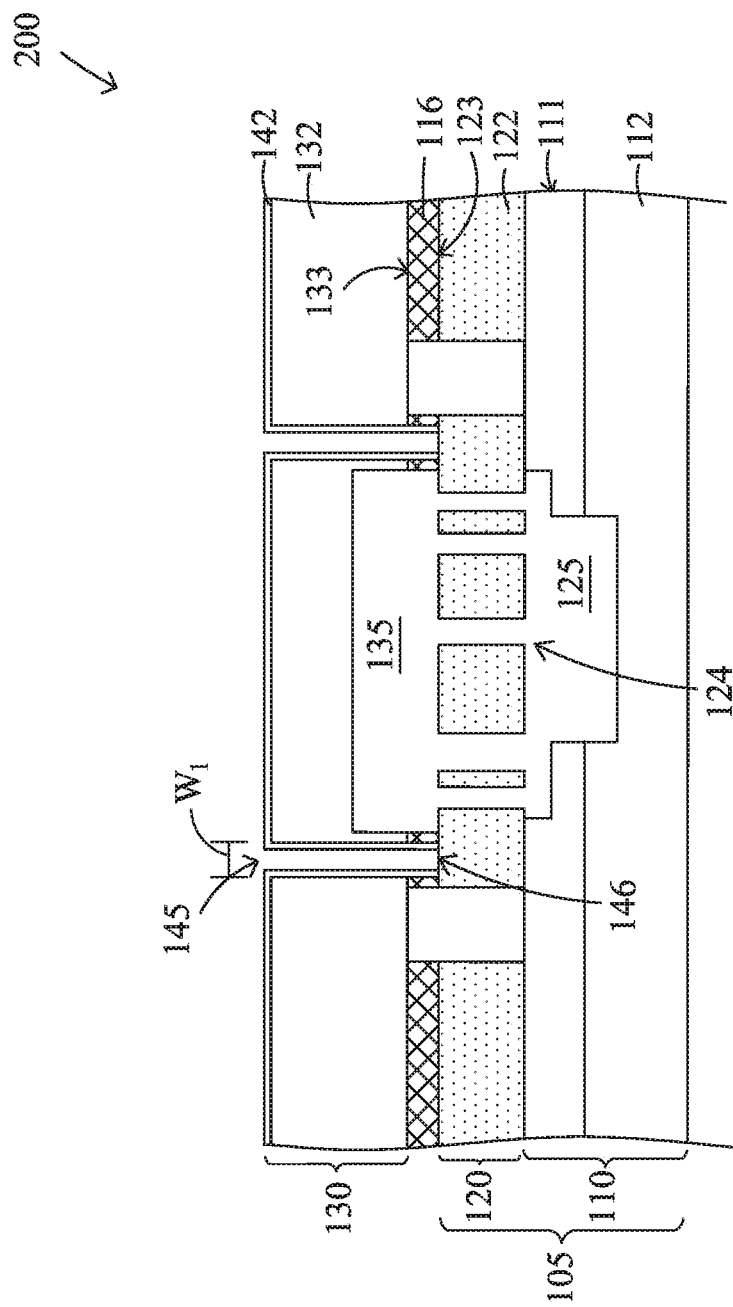

After the isolation layer 142 is deposited, the isolation layer 142 at a bottom of the TSV openings 145 is removed to expose a conductive surface 146 of substrate 122. FIG. 2D shows the MEMS structure 200 after the isolation layer 142 at the bottom of the TSV openings 145 is removed, in accordance with some embodiments. The conductive surface 146 is made conductive by doping the substrate 122 with N-type or P-type dopants to increase the conductivity of semiconductor material of substrate 122, in accordance with some embodiments. In some embodiments, substrate 122 is provided as a highly doped substrate. Other mechanisms for forming the conductive surface 146 may also be used. The conductive surface 146 enables the TSVs formed to establish ohmic contacts with the conductive surface 146. Substrate 122 may be doped to enable electrical connections between the TSVs, the MEMS devices 124 in substrate structure 120, and the interconnect and devices in substrate structure 110. Alternatively, an interconnect may also be formed to enable the electrical connections.

After the isolation layer 142 at the bottom of TSV openings 145 is removed to expose conductive surface 146, a contact metal layer 143 is deposited. The contact metal layer 143 electrically contacts surface 146. In some embodiments, the contact metal layer includes at least two sub-layers, a barrier layer and a copper seed layer. The barrier layer establishes ohmic contact with surface 146 and may be made of one or more copper barrier materials, such as Ta, TaN, Ti, TiN, CoW, or the like. The barrier layer provides protection against copper diffusing into the substrates 132 and 122. The barrier layer can be deposited by PVD (physical vapor deposition), chemical vapor deposition (CVD), atomic layer deposition (ALD), or other suitable methods. After the deposition of the barrier layer, a copper seed layer is deposited. The similarly, the copper seed layer can be deposited by PVD (physical vapor deposition), chemical vapor deposition (CVD), atomic layer deposition (ALD), or other suitable methods. In some embodiments, the barrier/Cu-seed layer 143 is made of TaN/Ta barrier and a copper seed layer. In some embodiments, each thickness of TaN and Ta is between about 100 Å to about 2000 Å, and the thickness of the copper seed is between about 1000 Å to about 15000 Å.

Figure 2E:
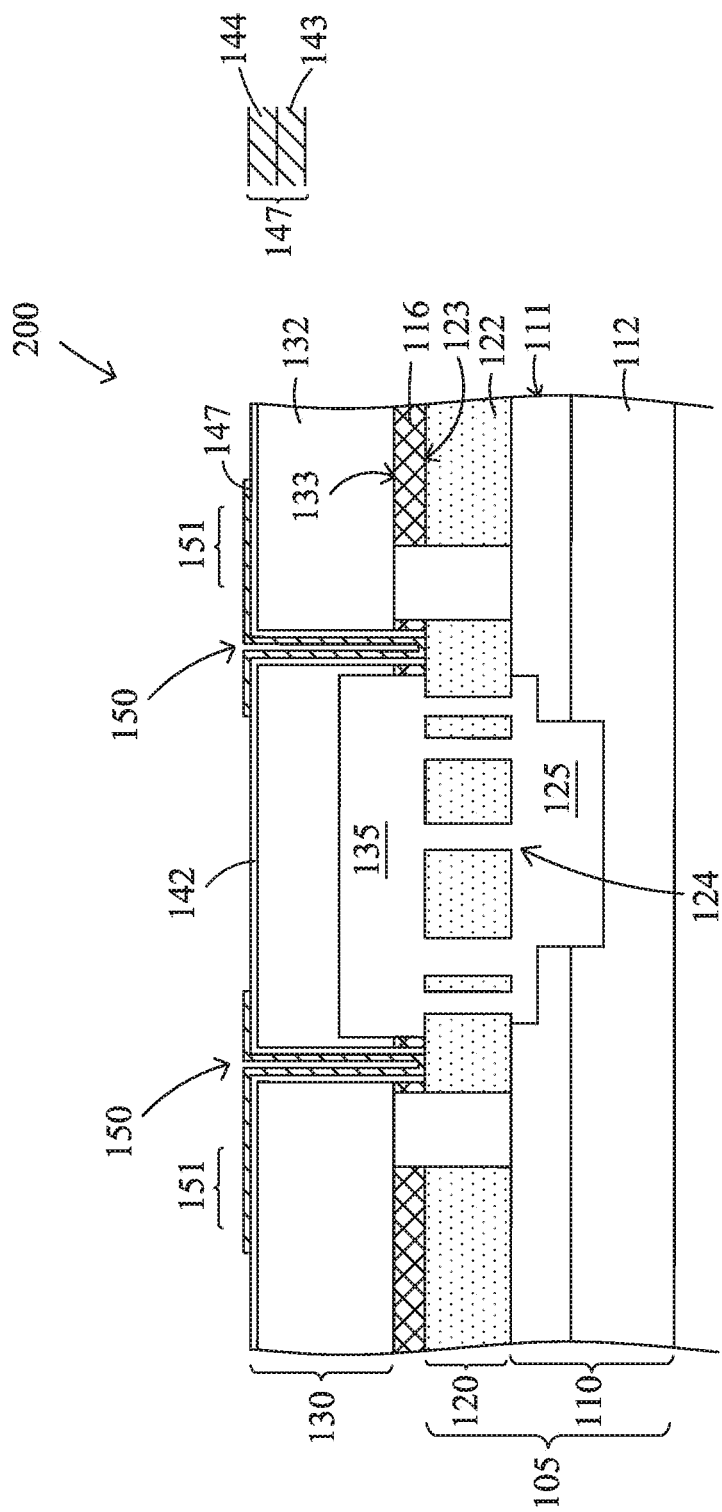

After the deposition of the barrier/copper-seed layer 143, MEMS structure 200 is patterned by a photoresist (not shown) to define areas to receive copper plating. A copper film 144 is than plated on the MEMS structure 200. The photoresist is then removed. The barrier/Cu-seed layer 143 not covered by the copper film 144 is then removed after the photoresist is removed by etching, in accordance with some embodiments. The barrier/copper-seed layer 143 and the copper film 144 form the TSV metal layer 147. FIG. 2E shows MEMS structure 200 after the excess barrier/Cu-seed layer 143 is removed, in accordance with some embodiments.

Electrical copper plating (ECP) processes or electroless copper plating process used in the metal interconnects of semiconductor device manufacturing can be used. In some embodiments, the thickness of the copper film 144 is less than about 40 mm. In other embodiments, the thickness of the copper film 144 is less than about 30 mm. In yet some other embodiments, the thickness of the copper film 144 is in a range from about 1 mm to about 25 mm. A copper film that is too thick could result in substrate warping. In some embodiments, the copper film 144 is deposited to fill the TSV openings 145 of TSVs 150. In some other embodiments, the copper film 144 is deposited to partially fill the TSV openings 145 of TSVs 150, as shown in FIG. 2E. During the formation of TSVs 150, contact regions 151 next to TSVs 150 are also formed. Contact regions 151 are used to form external contacts, as described below. Details of an exemplary mechanism of forming TSVs can be found in U.S. patent application Ser. No. 12/897,124, titled "Novel Semiconductor Package With Through Substrate Vias," and filed on Nov. 4, 2010, which is incorporated herein in its entirety.

Figure 2F:
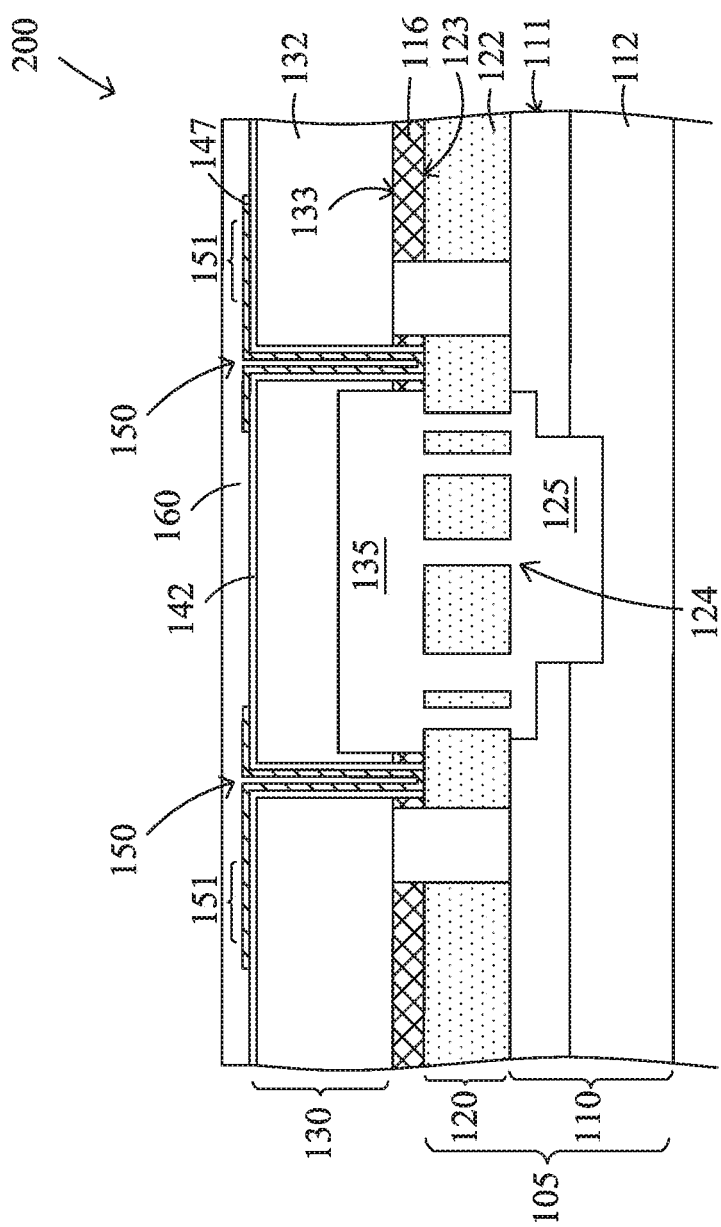
Figure 2G:
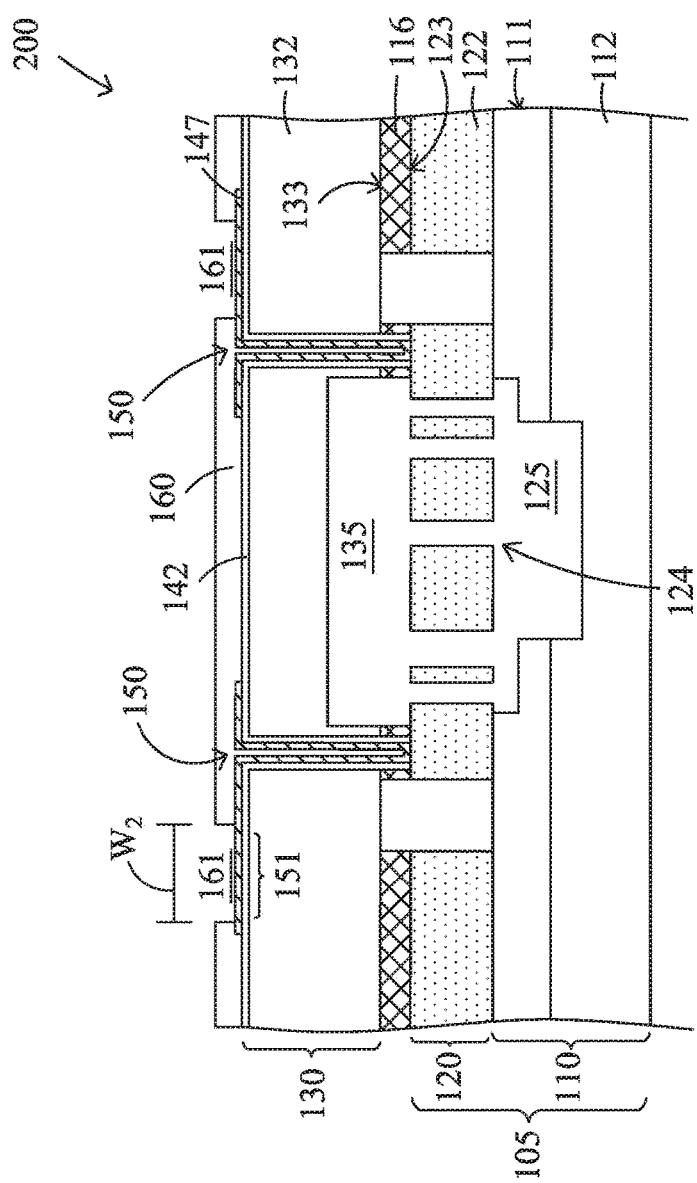

FIG. 2F depicts a passivation layer 160 is formed on MEMS structure 200, in accordance with some embodiments. Passivation layer 160 is formed to protect a surface of MEMS structure 200. In some embodiments, the passivation layer 160 is made of a polymer, such as an epoxy, polyimide, benzocyclobutene (BCB), polybenzoxazole (PBO), and the like, although other soft, often organic, dielectric materials can also be used. In some embodiments, the passivation layer 160 is a polyimide layer. In some other embodiments, the passivation layer 160 is a polybenzoxazole (PBO) layer. The passivation layer 160 is soft, and hence has the function of reducing inherent stresses on respective substrate. In addition, the passivation layer 160 can be formed to a thickness of tens of microns. The passivation layer 160 is then patterned to form openings 161 for external contacts, as shown in FIG. 2G in accordance with some embodiments. Openings 161 have a width $W_2$. In some embodiments, $W_2$ is in a range from about 50 μm to about 500 μm. A photoresist layer (not shown) is deposited and patterned to define the openings 161 over contact regions 151.

Figure 2H:
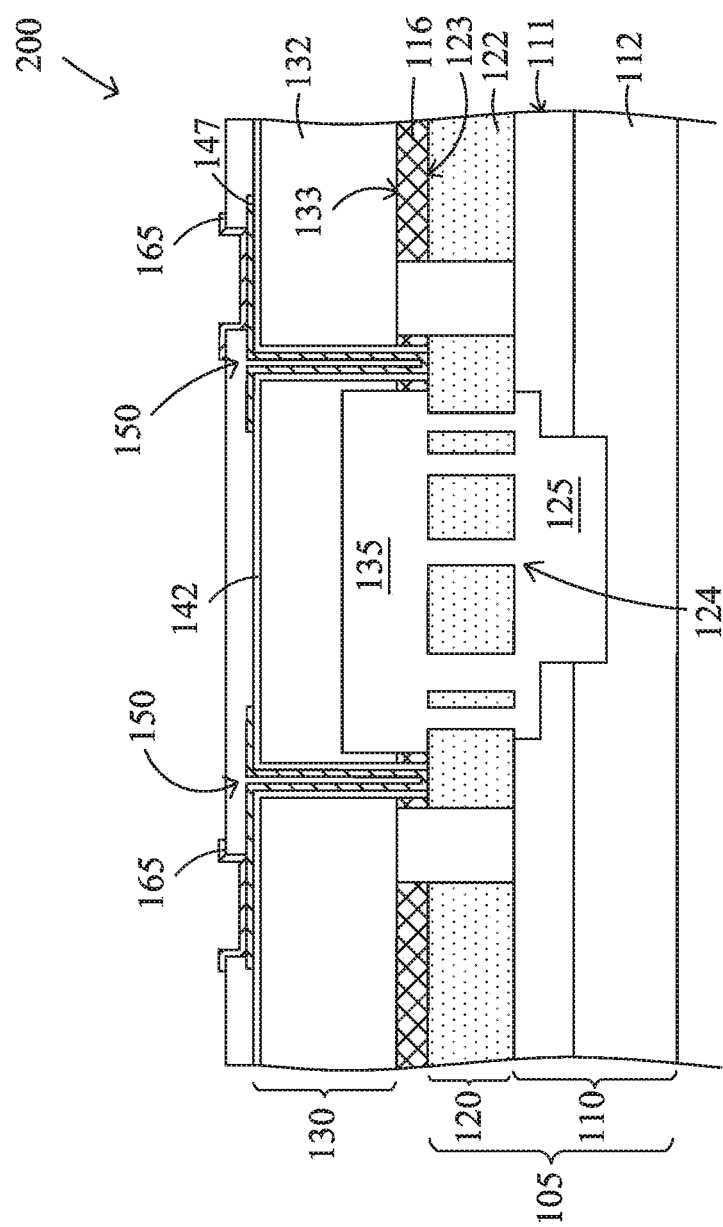

After openings 161 are formed, an under-bump-metallurgy (UBM) layer 165 is formed on the resulted structure of FIG. 2G. In some embodiments, the UBM layer 165 includes a diffusion barrier layer and a seed layer. FIG. 2H shows that the UBM layer 165 is formed on the passivation layer 160 and lines sidewalls and a bottom of the openings 161, in accordance with some embodiments. The diffusion barrier layer may be formed of tantalum nitride, although it may also be formed of other materials such as titanium nitride, tantalum, titanium, or the like. The thickness of the diffusion barrier layer is in a range from about 500 Å to about 5000 Å, in some embodiments. In some embodiments, the diffusion barrier layer is formed by physical vapor deposition (PVD) (or sputtering). The seed layer may be a copper seed layer formed on the diffusion barrier layer. The copper seed layer may be formed of copper or one of copper alloys that include silver, chromium, nickel, tin, gold, and combinations thereof. The thickness of the copper seed layer is in a range between about 2000 Å to about 10,000 Å, in some embodiments In some embodiments, the UBM layer 165 includes a diffusion barrier layer formed of Ti and a seed layer formed of Cu. In some embodiments, both the diffusion barrier layer, such as a Ti layer, and the seed layer, such as a Cu layer, are deposited by physical vapor deposition (PVD) (or sputtering) methods. An excess portion of UBM layer 165 not covering or surrounding openings 161 is removed by patterning and etching. External contacts, such as bumps or wires, may be formed on the UBM layer 165. Details of an exemplary mechanism of forming bumps can be found in U.S. patent application Ser. No. 12/846,353, titled "Mechanisms for Forming Copper Pillar Bumps," and filed on Jul. 29, 2010, which is incorporated herein in its entirety. Other mechanisms of forming bumps or balls as external contacts may also be used.

In one aspect of this description, a device is provided. The device includes a capping substrate, and a substrate structure. The substrate structure includes at least one microelectro mechanical system (MEMS) device, and the substrate structure is bonded to the capping substrate by a fusion bonding layer. There is at least one cavity surrounding at least a portion of the MEMS device.

In another aspect of this description, a micro-electro mechanical system (MEMS) structure is provided. The MEMS structure includes a first substrate embedded with a TSV, and the first substrate has a first cavity. The MEMS structure includes a second substrate structure bonded to the first substrate by a fusion bonding layer, and the second substrate structure including at least one MEMS device. The MEMS structure includes a third substrate structure coupled to the second substrate structure and the third substrate structure has an integrated circuit (IC) device. The third substrate structure has a second cavity, and the first and second cavities surround at least a portion of the at least one MEMS device.

In still another aspect of this description, a method of forming a micro-electro mechanical system (MEMS) structure is provided. The method includes providing a first substrate structure and bonding a second substrate structure to the first substrate structure using fusion bonding. The second substrate structure includes at least one micro-electro mechanical system (MEMS) device, and there is at least one cavity surrounding at least a portion of the MEMS device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a micro-electro mechanical system (MEMS) structure, the method comprising:
    providing a first substrate structure having a first layer with a first silicon surface, wherein the providing the first substrate structure includes forming the first layer having the first silicon surface consisting of silicon;
    providing a second substrate having a second layer with a second silicon surface, wherein the providing the second substrate includes forming the second layer having the second silicon surface consisting of silicon;
    bonding the second substrate to the first substrate structure using fusion bonding, wherein the bonding forms a fusion bonding interface between the first and second silicon surfaces, wherein the second substrate includes at least one micro-electro mechanical system (MEMS) device, and wherein there is at least one cavity surrounding at least a portion of the MEMS device; and
    forming a through silicon via (TSV) in the first substrate structure and through the fusion bonding interface between the first substrate structure and the second substrate such that a conductive layer of the TSV extends through the fusion bonding interface.

2. The method of claim 1, wherein the bonding is performed at a temperature between about 500 Celsius and 1200 Celsius.

3. The method of claim 1, further comprising:
    thinning the first substrate structure.

4. The method of claim 1, further comprising:
    making at least one of the first silicon surface and the second silicon surface hydrophobic before the bonding.

5. The method of claim 1, making both of the first silicon surface and the second silicon surface hydrophobic before the bonding.

6. The method of claim 1, wherein the bonding includes pressing the first and second silicon surfaces together and annealing the first substrate structure and second substrate.

7. A method of forming a micro-electro mechanical system (MEMS) structure, the method comprising:
provide a first substrate structure having a first layer with a first silicon surface;
providing a second substrate having at least one micro-electro mechanical system (MEMS) device and having disposed thereon a second layer with a second silicon surface, wherein the second layer is formed over and interfaces a top surface of the second substrate, the top surface being a semiconductor material;
fusion bonding the second substrate to the first substrate structure, wherein the fusion bonding forms a bonding interface between the first and second silicon surfaces; and
forming an interconnect through the first substrate structure and the bonding interface to contact the top surface of the second substrate.

8. The method of claim 7, wherein providing the first substrate structure and second substrate prior to the fusion bonding does not include providing a metal component.

9. The method of claim 8, wherein the fusion bonding includes a temperature in a range from about 900° C. to about 1200° C.

10. The method of claim 7, further comprising:
performing an HF release process on the MEMS device.

11. The method of claim 7, wherein the first substrate structure is a capping substrate.

12. The method of claim 7, further comprising, prior to the fusion bonding making the first and second silicon surfaces hydrophobic.

13. The method of claim 7, wherein the second silicon surface consists of silicon and wherein the first silicon surface consists of silicon.

14. A method of forming a micro-electro mechanical system (MEMS) structure, the method comprising:
providing a first substrate structure, wherein a first layer with a first silicon surface is disposed on the first substrate structure;
providing a second substrate, wherein a second layer with a second silicon surface is disposed on the second substrate a bottommost surface of the second layer interfacing the second substrate;
fusion bonding the second substrate to the first substrate structure, wherein the fusion bonding includes: annealing the first substrate structure and second substrate to form a bonding interface between the first and second silicon surfaces; and
forming an interconnect through the first substrate structure and the bonding interface and contacting the second substrate below the second layer, wherein a bottommost surface of the interconnect is coplanar with the bottommost surface of the second layer.

15. The method of claim 14, wherein the forming the interconnect includes:
forming an opening in the first substrate structure and the bonding interface to expose a top surface of the second substrate; and
depositing a conductive material in the opening to form a through-silicon-via (TSV).

16. The method of claim 15, wherein the second substrate has at least one micro-electro mechanical system (MEMS) device.

17. The method of claim 14, wherein the annealing is performed at between about 900 Celsius and 1200 Celsius.

18. The method of claim 14, further comprising: providing the first silicon surface and the second silicon surface as hydrophobic prior to the fusion bonding.

19. The method of claim 18, wherein the providing the first and second silicon surfaces as hydrophobic includes providing the hydrophobicity prior to contacting the first silicon surface to the second silicon surface.

20. The method of claim 14, wherein the first silicon surface consists of silicon and wherein the second silicon surface consists of silicon.

* * * * *